US005726536A

United States Patent [19]

Hagiwara

[11] Patent Number: 5,726,536

[45] Date of Patent: Mar. 10, 1998

[54] METHOD OF DRIVING A COLD CATHODE TUBE USING A CERAMIC TRANSFORMER

[75] Inventor: Nobumi Hagiwara, Yokosuka, Japan

[73] Assignee: Tamura Corporation, Tokyo, Japan

[21] Appl. No.: 576,795

[22] Filed: Dec. 21, 1995

Related U.S. Application Data

[63] Continuation of Ser. No. 243,670, May 16, 1994, abandoned.

[51] Int. Cl.$^6$ .................................................... H01L 41/08

[52] U.S. Cl. ...................... 315/276; 331/116 R; 345/102; 315/55; 315/307; 310/311; 310/314; 310/318

[58] Field of Search .................................... 315/276, 307, 315/55; 331/178, 116 R; 310/311, 314, 318; 345/102, 212

[56] References Cited

U.S. PATENT DOCUMENTS 4,054,806 10/1977 Moriki et al. .

*Primary Examiner*—Robert Pascal
*Assistant Examiner*—Arnold Kinkead
*Attorney, Agent, or Firm*—Joseph C. Mason, Jr.

[57] ABSTRACT

A cold cathode tube is used for a back light illuminating a liquid crystal with a light from the back. A ceramic transformer is used instead of a conventional wound transformer for a power source to light this cold cathode tube to eliminate various problems caused by transformers. The output voltage and current of this ceramic transformer are coordinated with the cold cathode tube by utilizing the frequency characteristic of the boosting ratio of the ceramic transformer to light the cold cathode tube and adjust the light. The output from an oscillator is amplified and is applied to a ceramic transformer. The output frequency from the oscillator is swept from the higher side to the lower side. When the output frequency decreases from fa→fb, the output voltage of the ceramic transformer in the case that the load resistance indicated by the solid line is large will be Vb and the cold cathode tube will be lighted. When lighted, the impedance of the cold cathode tube will quickly decrease and the voltage will shift to the output voltage Vc of the ceramic transformer in the case that the load resistance indicated by the broken line is small. The frequency is further decreased to fd to apply a proper voltage Vd to the cold cathode tube and adjust the luminance.

1 Claim, 2 Drawing Sheets

METHOD OF DRIVING A COLD CATHODE TUBE USING A CERAMIC TRANSFORMER

This is a continuation of application Ser. No. 08/243,670, filed on May 16, 1994, now abandoned.

BACKGROUND OF THE INVENTION

1. Field of the Invention

This invention relates to systems of driving a cold cathode tube used for a light source for a back light illuminating a liquid crystal with a light from the back and more particularly to a system of driving a cold cathode tube using a ceramic transformer.

2. Description of the Prior Art

A cold cathode tube is usually used for a light source used for a back light illuminating a liquid crystal with a light from the back. An inverter for the cold cathode tube is used as a light source for lighting this cold cathode tube. Such high voltage as about 1200 V required to light the cold cathode tube is obtained by boosting a voltage of 5 to 15 V by winding a wound transformer on the secondary side by several thousand rounds. Such fine wire as of about 40 microns is used for this winding. When a wound transformer with many of such fine wires is used, such problems as breaks and rare shorts will occur and many steps will be required. If a wound transformer is used for a personal computer or the like of a note book type required to be thin, there will be a structural limit to making it small. A system of substituting a piezo-electric transformer of a ceramic plate for the wound transformer is being investigated to improve this problem.

However, in a system of driving a cold cathode tube using a piezo-electric transformer substituted for the conventional wound transformer, due to the property that the piezo-electric transformer passes only the frequency of a fixed narrow band, there are problems that it is hard to coordinate the frequencies of the oscillator and piezo-electric transformer and that it is difficult to take out a sufficient output.

SUMMARY OF THE INVENTION

The present invention is made in view of such points and has it as an object to eliminate various problems caused by the wound transformer by using a piezo-electric transformer (which shall be mentioned as a ceramic transformer hereinafter) and to provide a system of driving a cold cathode tube using a ceramic transformer lighting the cold cathode tube and adjusting the light by accurately controlling the oscillating frequency.

In order to solve the above mentioned problems, the system of driving a cold cathode tube using a ceramic transformer by the present invention is characterized in that, in the system of driving a cold cathode tube using a ceramic transformer lighting the cold cathode tube by a high voltage obtained by utilizing a frequency characteristic of the boosting ratio of the ceramic transformer, the output from an oscillator is given to the ceramic transformer, the output frequency of the above mentioned output is swept from the higher side to the lower side, the above mentioned output frequency is fixed with the frequency of a boosting ratio at which the cold cathode tube is lighted and the driving frequency of the ceramic transformer is controlled to light the cold cathode tube.

Another system of driving a cold cathode tube using a ceramic transformer according to the present invention is characterized in that, in the system of driving a cold cathode tube using a ceramic transformer lighting the cold cathode tube by a high voltage obtained by utilizing a frequency characteristic of the boosting ratio of the ceramic transformer, the output of an oscillator is given to the ceramic transformer, the output frequency of the above mentioned output is swept from the higher side to the lower side, the cold cathode tube is lighted in a negative inclination of the frequency characteristic of the boosting ratio of the ceramic transformer increasing in the boosting ratio of the ceramic transformer with the decrease of the above mentioned output frequency, the above mentioned output frequency is fixed with the frequency of the boosting ratio at which the cold cathode tube is lighted and the load current flowing through the cold cathode tube is controlled by the voltage obtained by utilizing the frequency characteristic of the boosting ratio of the ceramic transformer conforming to the quick decrease of the impedance of the cold cathode tube by lighting to adjust the luminance of the cold cathode tube.

The output from the oscillator is given to the ceramic transformer. The output frequency from the oscillator is swept from the higher side to the lower side. In response to the variation of this output frequency, the boosting ratio of the ceramic transformer rises or falls. That is to say, the boosting ratio of the ceramic transformer has a resonance by the frequency. The output frequency of the oscillator is fixed with the frequency of the boosting ratio at which the cold cathode tube is lighted. The cold cathode tube is lighted by thus controlling the driving frequency of the ceramic transformer.

DETAILED DESCRIPTION OF THE PREFERRED EMBODIMENT

Figure 3:
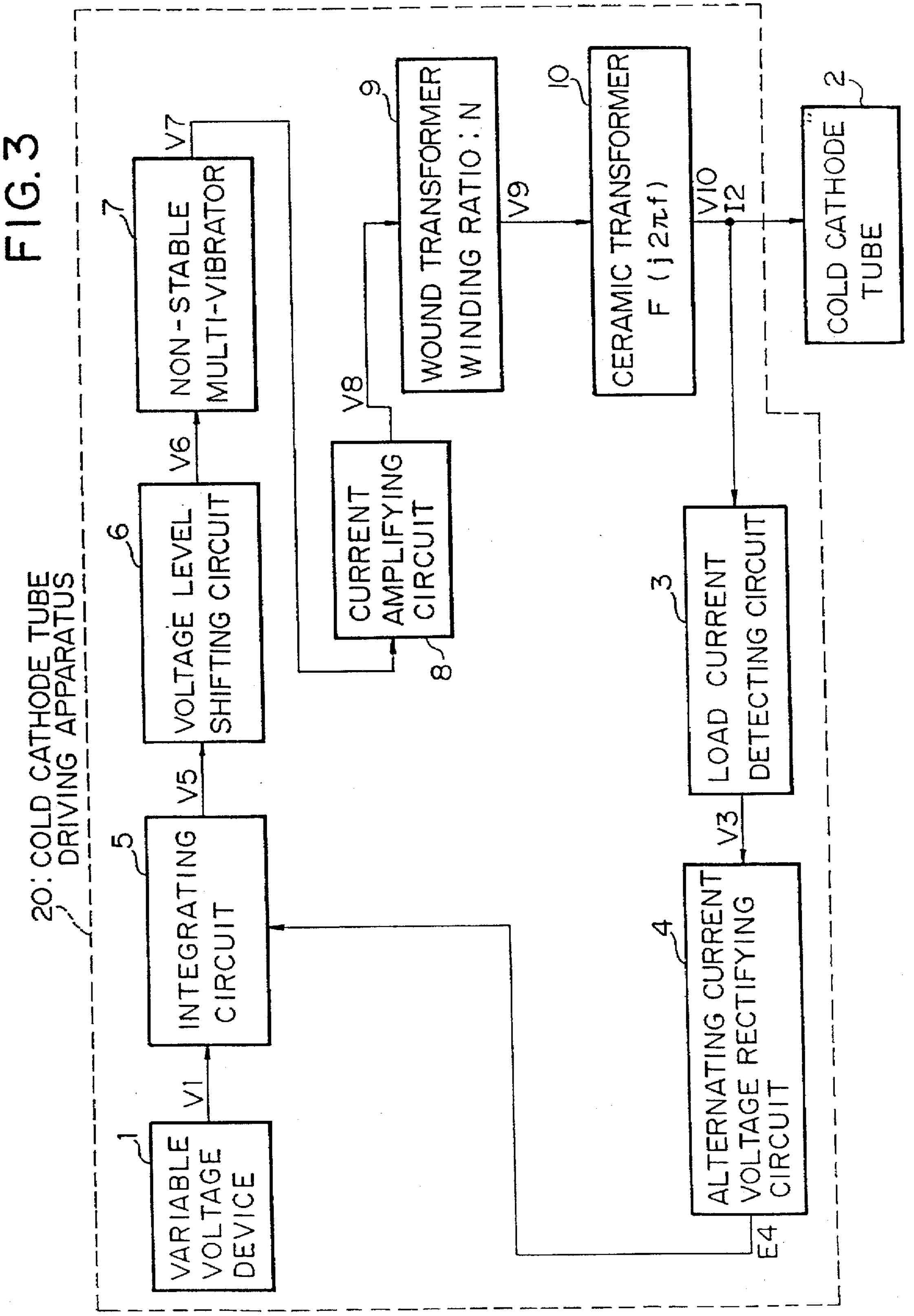
FIG. 3 is a schematic block diagram showing a formation of a cold cathode tube driving apparatus for working the system of driving a cold cathode tube using a ceramic transformer according to the present invention.

An embodiment of the present invention shall be explained in the following with reference to the drawings. FIG. 3 is a schematic block diagram showing a formation of a cold cathode tube driving apparatus for lighting a cold cathode tube using a ceramic transformer according to the present invention and for adjusting the luminance. In the diagram, the numeral 2 represents a cold cathode tube driving apparatus, 1 represents a variable voltage device for determining a set voltage to determine a load current, 2 represents a cold cathode tube to be a back light source of a liquid crystal, I2 represents a load current flowing through the cold cathode tube 2 which is a load, 3 represents a load current detecting circuit detecting the load current I2, 4 represents an alternating current voltage rectifying circuit rectifying an alternating current voltage proportional to the load current detected by the load current detecting circuit 3, 5 represents an integrating circuit integrating the difference voltage between the set voltage from the variable voltage device 1 and the output voltage from the alternating current voltage rectifying circuit 4, 6 represents a voltage level shifting circuit shifting the voltage level, 7 represents a non-stable multi-vibrator oscillating a frequency proportional to the output voltage of the voltage level shifting circuit, 8 represents a currant amplifying circuit amplifying the output current of the non-stable multi-vibrator, 9 represents a wound transformer to be inserted as required and 10 represents a ceramic transformer.

First of all, the general operating principle of the cold cathode tube driving apparatus shall be explained. The set voltage of the variable voltage device 1 shall be represented by V1, the size of the load current of the cold cathode tube 2 shall be represented by I2, the output voltage of the load current detecting circuit 3 shall be represented by V3, the output of the alternating current voltage rectifying circuit 4 shall be represented by E4, the output of the integrating circuit 5 shall be represented by V5, the output voltage of the voltage level shifting circuit 6 shall be represented by V6, the shifted voltage shall be represented by V06, the oscillating frequency of the non-stable multi-vibrator 7 shall be represented by f7, the output voltage of the current amplifying circuit 8 shall be represented by V8, the boosting ratio of the wound transformer 9 shall be represented by N, the output voltage shall be represented by V9, the frequency characteristic of the ceramic transformer 10 shall be represented by F (j 2 π f) and the output voltage shall be represented by V10.

The inputs and outputs in the respective blocks from the set voltage V1 to the load current I2 hold the following formulae:

$$V3=k1\cdot 12 \quad (1)$$

$$E4=k2\cdot V3 \quad (2)$$

$$V5\ (t)=k3\int (E4-V1)\,dt \quad (3)$$

$$V6=V5+V06 \quad (4)$$

$$f7=k4\cdot V6 \quad (5)$$

$$V8=Vp\sin 2\pi f7\ t=Vp\sin 2\pi k4\cdot V6\ t \quad (6)$$

$$V9=N\cdot V8 \quad (7)$$

$$\begin{aligned} V10 &= |F(j2\pi f7)|V9 \\ &= N|F(j2\pi k4\cdot V6)| \\ &\quad Vp\sin 2\pi k4\cdot V6t \end{aligned} \quad (8)$$

$$I2=N\,|\,F\,(j\,2\pi\,k\,4\cdot V6)\,|\,Vp/ZL \quad (9)$$

wherein Vp represents an output amplitude of the current amplifying circuit 8 and ZL represents an impedance of the cold cathode tube 2.

When the integrated value of the integrating circuit 2 is 0, that is, $$E4-V1=0, \quad (10)$$

the output will not vary and will be constant.

$$k2\cdot V3-V1=k1\cdot k2\cdot I2-V1=0 \quad (11)$$

is obtained from (10), (2) and (1). From this, the size of the load current I2 when the variation ends will be $$I2=V1/k1\cdot k2 \quad (12)$$

Thus, the load current flowing through the cold cathode tube 2, that is, the luminance of the cold cathode tube 2 will be determined by the set voltage V1.

Figure 2:
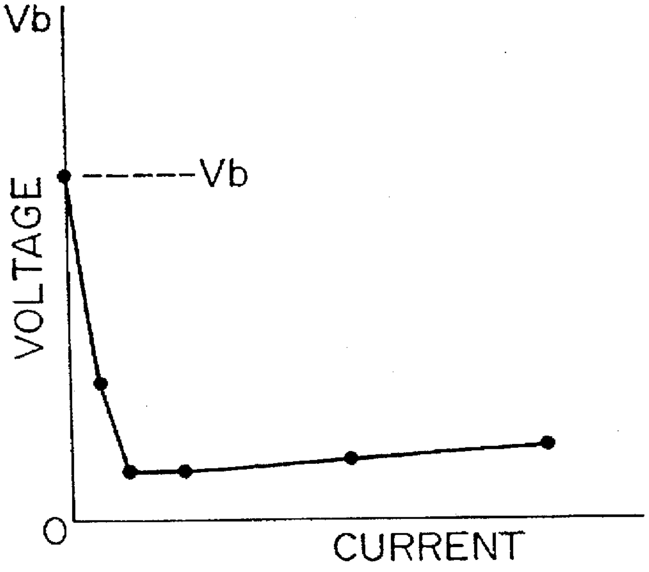
FIG. 2 is a graph showing a current-voltage characteristic of a cold cathode tube used in an embodiment of the present invention.

FIG. 2 shows a current-voltage characteristic of the cold cathode tube. As shown in the graph, a high resistance is shown between the electrodes of the cold cathode tube 2 until it is lighted. The lighting voltage Vb requires to be such high voltage as about 1000 V but after the lighting, the resistance will quickly reduce and a current will flow through the cold cathode tube 2. The voltage Vd is to correspond to this load current. Therefore, the cold cathode tube driving apparatus is required to have a high voltage generated until the lighting but to have the voltage reduced after the lighting. In the high voltage generating apparatus of a ceramic transformer utilizing a piezo-electric phenomenon, the boosting ratio greatly varies with the driving frequency and the frequency characteristic greatly varies with the load impedance.

Figure 1:
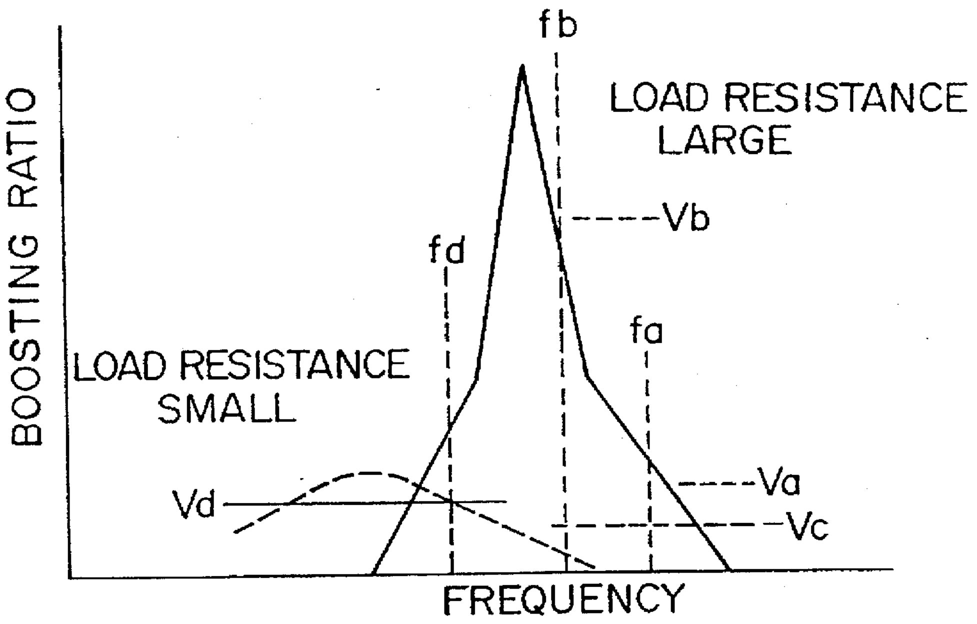
FIG. 1 is a graph showing various characteristics of a ceramic transformer for explaining a system of driving a cold cathode tube using a ceramic transformer.

FIG. 1 shows an example of the frequency characteristic of the boosting ratio of a ceramic transformer with a solid line in case the load resistance is large (the state before the cold cathode tube is lighted) and with a broken line in case the load resistance is small (the state after the cold cathode tube is lighted). When the power source of the cold cathode tube driving apparatus 20 is engaged, the output voltage of the integrating circuit 5 will be 0. At this time, the oscillating frequency f7 will be output from the non-stable multi-vibrator 7 by the output voltage V06 of the voltage level shifting circuit 6. This oscillating frequency f7 is the frequency fa in the graph. At this time, the output voltage V10 of the ceramic transformer 10 is Va and does not reach the voltage Vb required to light the cold cathode tube 2 and therefore the cold cathode tube 2 is not lighted. Therefore, $$I2=V3=E4=0$$

and the output of the integrating circuit 2 is $$V5\ (t)=-k3\cdot V1t$$

Therefore, the oscillating frequency of the non-stable multi-vibrator 7 reduces with the time as in $$f7=k4\ (V06-k3\cdot V1t)$$

As a result, in the mean time, f7 will become fb, the output voltage V10 of the ceramic transformer will become a voltage Vb required to light the cold cathode tube 2 and the cold cathode tube 2 will light. When the cold cathode tube 2 lights, the impedance will become small and accordingly the boosting ratio of the ceramic transformer 10 will shift to the characteristic shown by the broken line.

At the time, the output voltage V10 of the ceramic transformer 10 applied to the cold cathode tube 2 is Vc. In case the load current 12 by this voltage Vc does not give the necessary luminance, $$E4-V1<0$$

and the oscillating frequency f7 of the non-stable multi-vibrator 7 will continue to decrease. As a result, the load current 12 will increase according to the output voltage V10 of the ceramic transformer 10 and, in the mean time, at f7=fd, the output voltage V10 of the ceramic transformer 10 will become Vd. Then, $$E4-V1=k1\cdot k2\cdot I2-V1=0$$

Then, the output voltage V5 of the integrating circuit 2 will become constant and the load current I2 of the cold cathode tube 2 will be a set value. When the oscillating frequency F7 of the non-stable multi-vibrator 7 becomes smaller than fd, the load current 12 flowing through the cold cathode tube 2 will become larger than the set value and therefore will become $E4-V1>0$ Therefore, the oscillating frequency f7 of the non-stable multi-vibrator 7 will turn to increase. After all, the integrated value of the integrating circuit 5 will become 0, that is, $E4-V1=0$ and the circuit will equilibrate. As in the above, a light adjusting function varying the luminance of the cold cathode tube by utilizing the resonance characteristic of the ceramic transformer 10 is held. The nearer to the peak of the resonance curve of the ceramic transformer, the brighter the old cathode tube. The farther away from the peak, the darker the cold cathode tube.

As explained above, in the system of driving the cold cathode tube using the ceramic transformer according to the present invention:

as the output from the oscillator is given to the ceramic transformer, the output frequency of the above mentioned output is swept from the higher side to the lower side, the above mentioned output frequency is fixed with the frequency of the boosting ratio at which the cold cathode tube is lighted and the driving frequency of the ceramic transformer is controlled to light the cold cathode tube; and as the output from the oscillator is given to the ceramic transformer, the output frequency of the above mentioned output is swept from the higher side to the lower side, the cold cathode tube is lighted in the negative inclination of the frequency characteristic of the boosting ratio of the ceramic transformer in which the boosting ratio of the ceramic transformer increases with the decrease of the above mentioned output frequency, the above mentioned output frequency is fixed with the frequency of the boosting ratio at which the cold cathode tube is lighted and the load current flowing through the cold cathode tube is controlled by the voltage obtained by utilizing the frequency characteristic of the boosting ratio of the ceramic transformer conforming to the quick decrease of the impedance of the cold cathode tube by lighting to adjust the luminance of the cold cathode tube;

the serious problems caused by the wound transformer can be eliminated by using the ceramic transformer and the lighting of the cold cathode tube and the adjustment of the light can be easily made by controlling the oscillating frequency.

What is claimed is:

1. A method of driving a cold cathode tube using a ceramic transformer comprising the steps of:

applying an output frequency of an oscillator to the ceramic transformer;

sweeping the output frequency of the oscillator from a high frequency to a low frequency;

lighting a cold cathode tube on a negative slope of a frequency characteristic of a boosting ratio of the ceramic transformer, the negative slope of the frequency characteristic of the boosting ratio of the ceramic transformer increasing with a decrease in the output frequency of the oscillator;

maintaining a driving frequency at which the cold cathode tube is lighted on the negative slope of the frequency characteristic of the boosting ratio;

utilizing a frequency characteristic of a boosting ratio of the ceramic transformer corresponding to an impedance of the cold cathode tube having been greatly reduced by lighting the cold cathode tube to obtain an output voltage of the ceramic transformer; and controlling a load current flowing through the cold cathode tube by the output voltage of the ceramic transformer for adjusting a luminance of the cold cathode tube.

* * * * *